United States Patent
Sim

(10) Patent No.: US 6,199,184 B1
(45) Date of Patent: Mar. 6, 2001

(54) PARALLEL SIGNATURE COMPRESSION CIRCUIT AND METHOD FOR DESIGNING THE SAME

(75) Inventor: Gyoo-Chan Sim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/149,380

(22) Filed: Sep. 8, 1998

(30) Foreign Application Priority Data

Sep. 8, 1997 (KR) .................................................. 97-46201

(51) Int. Cl.⁷ .................................................. G01R 31/28
(52) U.S. Cl. .................................................. 714/732
(58) Field of Search .................. 714/732, 738, 714/739

(56) References Cited

U.S. PATENT DOCUMENTS

| | | | |
|---|---|---|---|
| 4,503,537 | * 3/1985 | McAnney | 714/728 |
| 4,801,870 | * 1/1989 | Eichelberger et al. | 714/736 |
| 5,051,996 | * 9/1991 | Bergeson | 714/732 |
| 5,412,665 | * 5/1995 | Gruodis et al. | 714/739 |
| 5,422,891 | * 6/1995 | Bushnell et al. | 714/732 |
| 5,475,694 | * 12/1995 | Ivanov et al. | 714/732 |
| 5,612,963 | * 3/1997 | Koenemann et al. | 714/739 |
| 5,831,992 | * 11/1998 | Wu | 714/732 |
| 6,055,660 | * 4/2000 | Meaney | 714/732 |

OTHER PUBLICATIONS

Van de Goor, Testing Semiconductor Memories, John Wiley & Sons, pp. 204–209, 1991.*
Hlawiczka, Hubird Design of Parallel Signature Analyzers, IEEE p. 354–360, 1989.*
Pradhan et al., Aliasing Probability for Multiple Input Signature Analyzer, IEEE, p. 586–591, Apr. 1990.*
Robinson, Aliasing Probabilities for Feedback Signature Compression of Test Data, IEEE, p. 867–872, 1991.*
Rajski et al., Fault Detection and Diagnosis Based on Signature Analysis, IEEE, p. 1877–1880, Jun. 1991.*
Sun et al., Error Identification and Data Retrieval in Signature Analysis based Data Compaction, IEEE, p. 177–184, Nov. 1996.*

* cited by examiner

Primary Examiner—Albert De Cady
Assistant Examiner—Shelly A Chase
(74) Attorney, Agent, or Firm—Myers Bigel Sibley & Sajovec

(57) ABSTRACT

A parallel signature compression circuit includes two or more MISRs (multiple input signature registers) coupled in series. The signature compression circuit allows the error effect of at least one of two repetitive error patterns to be transferred to a cell other than the cell where the error effect is counterbalanced. In an embodiment, a signature compression circuit has two MISRs and prevents the error masking due to the repetitive error patterns of the odd-numbered distances. In another embodiment, in order to reduce the error masking by the repetitive error patterns with even-numbered distances, the repetitive error patterns are compressed as many times as possible within the range of design rule.

8 Claims, 5 Drawing Sheets

PARALLEL SIGNATURE COMPRESSION CIRCUIT AND METHOD FOR DESIGNING THE SAME

FIELD OF THE INVENTION

The present invention relates to a signature analyzer circuit for fault detection in electronic circuits, and more particularly to a signature compression circuit that latches test outputs from an electronic circuit under test and compresses them in parallel.

BACKGROUND OF THE INVENTION

U.S. Pat. No. 5,051,996 issued to Bergeson et al. on Sep. 24, 1991 teaches the overall test methodology of testing semiconductor integrated circuit devices, all of whose disclosures are incorporated herein by reference. If component level isolation of fault is desired, the serial signature technique is appropriate. However, if all that are required is fault detection, the parallel technique is the appropriate choice.

In signature analysis, either the parallel or serial signature analyzer is utilized. For signature compression, a multiple input signature register (MISR) is incorporated in the parallel signature analyzer (PSA) while a single input signature register (SISR) is incorporated in the serial signature analyzer (SSA). Considering signature analyzer area, the parallel compression technique utilizing the MISR is more profitable than the serial compression technique utilizing the SISR; the former requires only one MISR but the latter requires a plurality of SISRs. Therefore, recently, the parallel signature compression method is widely used for effectively analyzing signatures.

FIG. 1 is a view schematically illustrating a parallel signature compression technique, which is usually employed to analyze high speed semiconductor integrated circuits. As shown in FIG. 1, a semiconductor integrated circuit 10, such as a microprocessor, a RAM (random access memory), a ROM (read only memory), or a PLA (programmable logic array), is tested. A test input pattern is given to the circuit under test 10 which provides test outputs (i.e., response data) to a compression circuit 12 (i.e., MISR). The test outputs are compressed in the compression circuit 12 in parallel. At the end of the test, a signature (resultant data) of the test is stored in the compression circuit 12. signature of the test which is generated by compressing the test outputs is read out of the compression circuit 12, and then the externally read contents are compared with expected values. Based on the comparison, the integrated circuit 10 is analyzed.

As described in "Testing Semiconductor Memories", by John Wiley & Sons, 1991, pp. 204–209, the signature generated by compressing a test output pattern with errors can be identical with the signature generated by compressing a test output pattern with no error. Namely, there can take place a masking of the signature obtained by compressing the erroneous pattern. The term "masking" defines that an erroneous test output pattern maps into the same signature as the good test outputs.

If the length of the pattern sequences outputted from the circuit under test is longer than the bit length n of the signature register and if respective patterns have the same error generation probability, it is generally known in the art that the probability of masking is $\frac{1}{2}^n$. However, since the above assumption is impracticable, it is required to pay more attention to applying the probability, depending on applications.

The MISR can be implemented in a software or hardware form. In particular, the hardware MISR is a major component of the built-in self test circuit for VLSI logics and memories.

FIG. 2 illustrates a typical MISR for compressing the response data of a circuit under test in parallel. As seen in the figure, MISR 20 includes 6 flip-flop circuits (hereinafter referred to as F—F circuits) 21-1, 21-2, . . . , and 21-6 corresponding to a 6-bit test output pattern P1–P6, respectively. Each F—F circuit 21-i is coupled to the next F—F circuit 21-(i+1) on the upper bit side via an exclusive OR (XOR) gate 23-(i+1), where i=1, 2, . . . , or 6. One XOR gate 23-i and one F—F circuit 21-i constitute a cell. The MISR 20 further includes a feedback tap 25. This tap 25 is coupled to an input of XOR gate 27 whose other input is coupled to the output of the F—F circuit 21-5. The output of the XOR gate 27 is applied to an input of XOR gate 23-1 in the lowest bit position.

Another structure of MISR is illustrated in FIG. 3. MISR 30 has the same circuit construction as the MISR 20 of FIG. 2, except for having a different feedback tap.

In MISR, if there are errors repetitively on the pattern sequence from a circuit under test, i.e., if MISR is used in compressing the repetitive error patterns, masking can take place. The term "repetitive error patterns" means that in two arbitrary patterns on the pattern sequence, errors are generated at the same interval as the distance between the two patterns. The repetitive error patterns have an odd-numbered distance or even-numbered distance according to the distance between the two patterns.

Repetitive error patterns with distance of 3 and repetitive error patterns with distance 4 are shown in Tables 1 and 2, respectively.

TABLE 1

| | Bit Positon | | | | | |
|---|---|---|---|---|---|---|
| | P1 | P2 | P3 | P4 | P5 | P6 |
| Pattern Sequence | 1 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 1 | 0 | 0 |

TABLE 2

| | Bit Positon | | | | | |
|---|---|---|---|---|---|---|
| | P1 | P2 | P3 | P4 | P5 | P6 |
| Pattern Sequence | 1 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 0 | 0 | 0 |
| | 0 | 0 | 0 | 0 | 1 | 0 |

In the Tables 1 and 2, each row represents a test output pattern. In each pattern, a good data bit is represented by "0" and an erroneous data bit by "1".

In Table 1, after an error appears in the first bit position P1 of the first error pattern of "100000", a repetitive error happens in the fourth bit position of the second error patter of "000100". Namely, the interval between the erroneous bit P1 of the first error pattern 100000 and the erroneous bit P4 of the second error pattern 000100 is equal to the instance between the first and second patterns (i.e., 3). Like this, in Table 2, the interval between the erroneous bit P1 of the first error pattern 100000 and the erroneous bit P5 of the second error pattern 000010 is equal to the instance between the first and second patterns (i.e., 4).

Table 3 shows the resultant data (i.e., signature) obtained by compressing the repetitive error patterns of Table 1 by means of the MISR 20 of FIG. 2.

TABLE 3

| | | Signature | | | |
|---|---|---|---|---|---|
| S1 | S2 | S3 | S4 | S5 | S6 |
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 0 | 0 | 0 |

As shown in Table 3, during the compression of first through third patterns, the erroneous bit P1 of the first error pattern 100000 in Table 1 is shifted twice. However, during the compression of the second error pattern 000100, it can be seen that the error effect is not propagated to the fourth F—F circuit 21-4 of FIG. 2. Namely, when the second error pattern 000100 is inputted to the MISR 20, its fourth signature bit S4 is "0". This means that the masking occurs. As a result, neither of error effects of the two error patterns is transferred to the signature Sout.

Table 4 shows the signature obtained by compressing the repetitive error patterns of Table 2 by means of the MISR 20 of FIG. 2.

TABLE 4

| | | Signature | | | |
|---|---|---|---|---|---|
| S1 | S2 | S3 | S4 | S5 | S6 |
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 1 | 0 | 0 |
| 0 | 0 | 0 | 0 | 0 | 0 |

As seen in Table 4, during the compression of first through fourth patterns, the erroneous bit P1 of the first error pattern 100000 in Table 1 is shifted three times. Also, during the compression of the second error pattern 000010, the error effect is not propagated to the fourth F—F circuit 21-5 of FIG. 2, so that the fifth signature bit S5 is "0". Due to this masking, neither of error effects of the two error patterns is also transferred to the signature Sout.

The above described repetitive error patterns may be easily found during memory fault detection. Therefore, it is required to consider the repetitive error patterns as an important input class of the MISRs used in testing integrated circuit memories.

SUMMARY OF THE INVENTION

It is an object of the present invention to provide a parallel signature compression register circuit with an improved error masking probability.

It is another object of the present invention to provide a method of designing a parallel signature compression register circuit.

These and other objects, advantages and features of the present invention are provided by a digital data compression circuit for compressing response data from an electronic circuit under test. The signature compression circuit allows the error effect of at least one of two repetitive error patterns to be transferred to a cell other than the cell where the error effect is counterbalanced.

According to an aspect of the invention, a preferred compression circuit includes a first multiple input signature register (MISR) which compresses the response data from the circuit under test in parallel and generates first signature, and a second MISR which is coupled to the first MISR in serial, compresses the first signature in parallel, and generates a second signature. The compression circuit may further comprise one or more additional MISRs coupled in serial to the second MISR in order. Each of the additional MISRs compresses outputs of its previous MISR in parallel and generates extra signature. The MISRs each may include at least one feedback tap.

According to another aspect of the invention, there is provided a preferred method for designing a compression circuit which includes at least two multiple input signature registers (MISRs) coupled in series and compresses response data from an electronic circuit under test. In the method, first, a maximum distance between the possible repetitive error patterns is sought, and a series of compression processes for the repetitive error patterns is performed. Then, the number of compression processes with no signature error masking for the repetitive error patterns is calculated. Thereafter, the number of the repetitive error patterns for the respective compression processes without error masking is checked, and finally the optimal number of the MISRs is determined based on the number of the repetitive error patterns. The number of the MISRs is preferably equal to or less than the maximum number of MISRs that an electronic circuit can hold.

BRIEF DESCRIPTION OF THE DRAWINGS

A further appreciation of the several aspects of the present invention will be gained by considering the following detailed description of preferred embodiments in conjunction with accompanying drawings wherein.

DETAILED DESCRIPTION OF THE PREFERRED EMBODIMENTS

Preferred embodiments of the present invention will now be described with reference to the accompanying drawings.

First Embodiment

Figure 1:
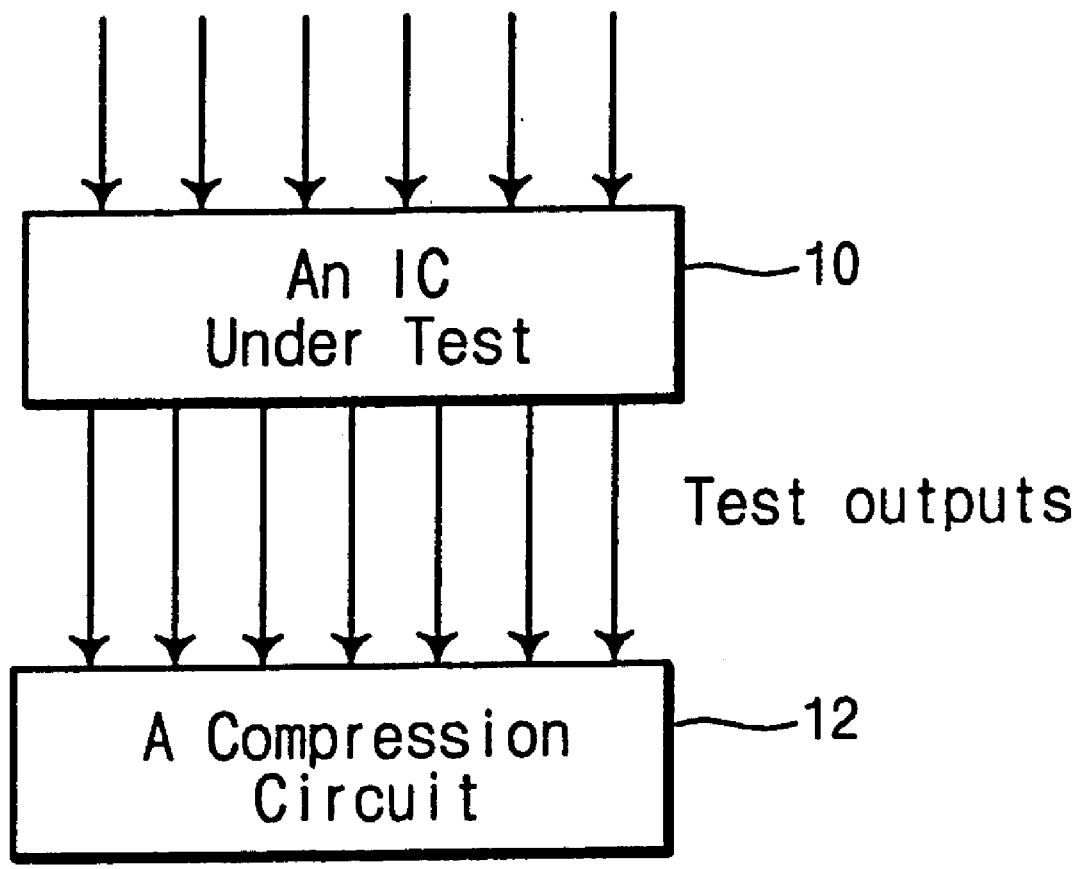
FIG. 1 is a view for schematically explaining a fault test of an integrated circuit.
Figure 2:
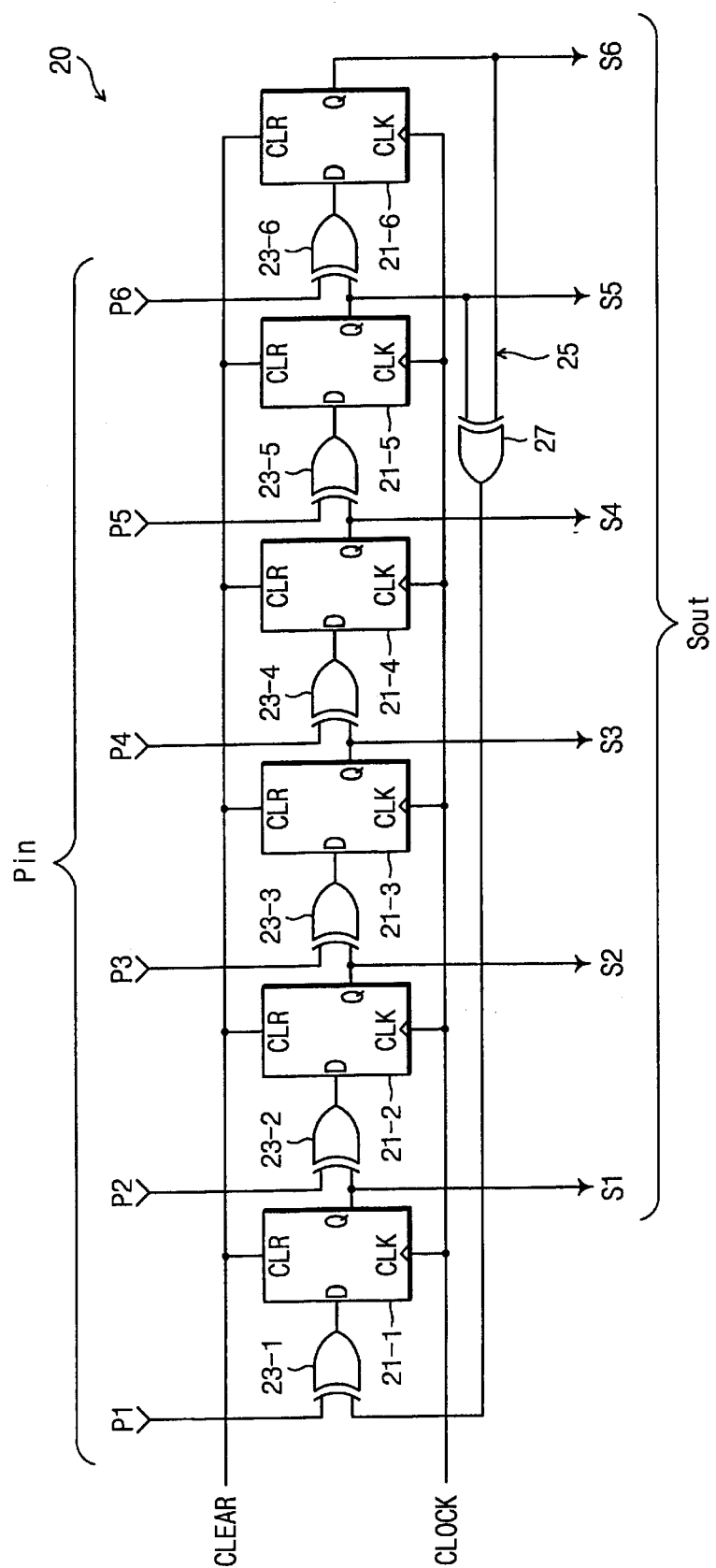
FIG. 2 is a circuit diagram illustrating a conventional parallel signature compression circuit.
Figure 3:
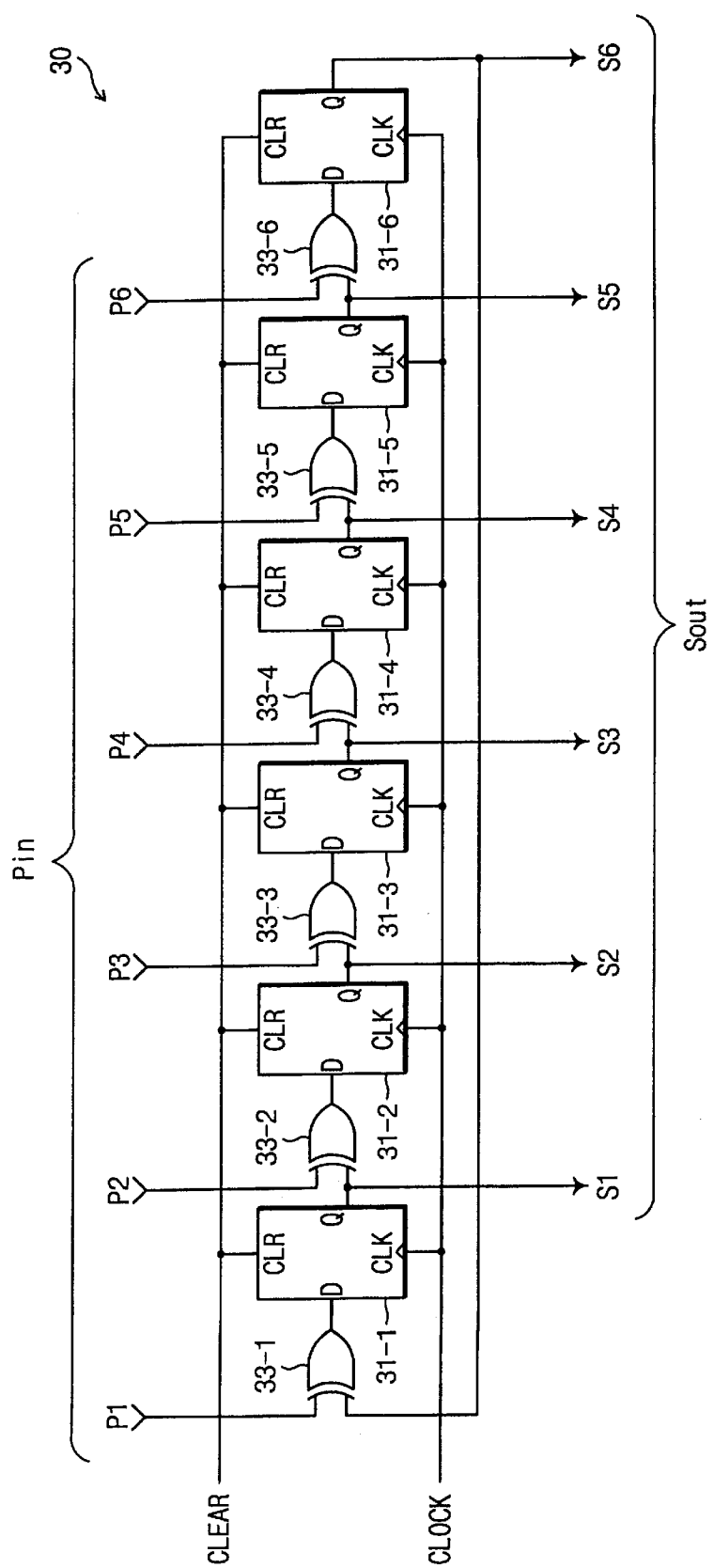
FIG. 3 is a circuit diagram illustrating another conventional parallel signature compression circuit.
Figure 4:
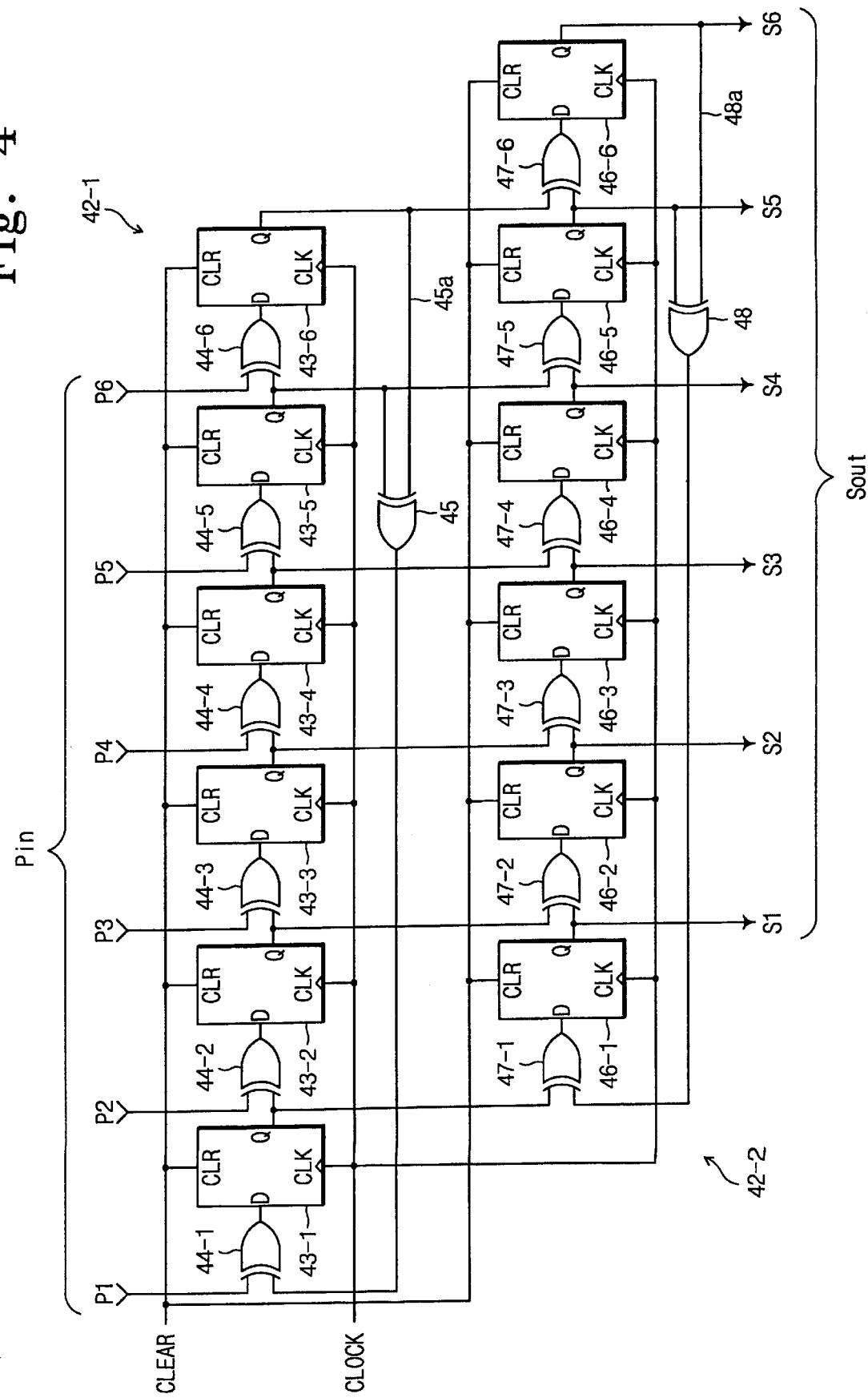
FIG. 4 is a circuit diagram illustrating an embodiment of a parallel signature compression circuit according to the present invention.

Referring to FIG. 4, a parallel signature compression register circuit 40 is illustrated. Although, for simplicity, 6-bit MISRs (multiple input signature registers) are used in the embodiment, the ability for finding out faults in a circuit under test increases with progression of the bit number that the compression circuit has. It is practical to employ 32-bit registers. The compression circuit 40 includes first and second 6-bit MISRs 42-1 and 42-2 coupled in series. With this arrangement, the embodiment can prevent the error masking due to the odd-numbered distance of the repetitive error patterns.

The first MISR 42-1 is comprised of 6 F—F (flip-flop) circuits 43-1, 43-2, ..., and 43-6. Each F—F circuit 43-i is coupled to the next F—F circuit 43-(i+1) on the upper bit side via a corresponding exclusive OR (XOR) gate 44-(i+1), where i=1, 2, ... , or 6. Each F—F circuit 43-i has an input D, an output Q, a clear control input CLR, and a clock input CLK. An input of the XOR gate 44-i is fed with a corresponding bit of the test outputs from a circuit under test. In addition, the first MISR 42-1 has a feedback tap 45a. This tap 45a is coupled to an input of XOR gate 45 whose the other input is coupled to the output Q of the F—F circuit 43-5. The output of the XOR gate 45 is applied to an input of XOR gate 43-1 in the lowest bit position.

The second MISR 42-2 also includes 6 F—F circuits 46-1, 46-2, ..., and 46-6. Each F—F circuit 46-i is coupled to the next F—F circuit 46-(i+1) on the upper bit side via a corresponding XOR gate 47-(i+1), where i=1, 2, ... , or 6. Each F—F circuit 46-i also has an input D, an output Q, a clear control input CLR, and a clock input CLK. An input of the XOR gate 47-i is fed with a corresponding bit of the output (i.e., signature) from the first MISR 42-1. The second MISR 42-2 also has a feedback tap 48a. This tap 48a is coupled to an input of XOR gate 48 whose the other input is coupled to the output Q of the F—F circuit 46-5. The output of the XOR gate 48 is applied to an input of XOR gate 46-1 in the lowest bit position.

According to the compression result of the repetitive error patterns with distance 3 (see Table 3) described in the earlier background section of this application, all the signature patterns obtained by compressing the first through third test patterns have the error effects, but the signature by the fourth test pattern (i.e., the second error pattern) has no error effect. The first through third signature patterns with the error effects are the repetitive error patterns of which the adjacent two have the distance of 1 to each other. The compression result of the signatures of Table 3 is listed in Table 5.

TABLE 5

| Signature | | | | | |
|---|---|---|---|---|---|
| S1 | S2 | S3 | S4 | S5 | S6 |
| 1 | 0 | 0 | 0 | 0 | 0 |
| 0 | 0 | 0 | 0 | 0 | 0 |
| 0 | 0 | 1 | 0 | 0 | 0 |
| 0 | 0 | 0 | 1 | 0 | 0 |

As can be seen in Table 5, during the compression of the signatures in Table 3 (i.e., the second compression), an error masking appears in the second signature but not in the third signature, allowing the last signature to have the error effect.

The compression of the odd-numbered repetitive error patterns is normalized as follows.

As shown in Table 6 below, first, consider repetitive error patterns where errors appear on the i-th bit of a first pattern and on the (i+k)-th bit of a second pattern having an odd-numbered distance of k from the first pattern.

TABLE 6

| Signature | Bit Position | | | | | | | |
|---|---|---|---|---|---|---|---|---|
| | i | i+1 | — | — | — | — | i+k−1 | i+k |
| i | 1 | 0 | 0 | 0 | — | 0 | 0 | 0 |
| — | 0 | 0 | 0 | 0 | — | 0 | 0 | 0 |
| — | 0 | 0 | 0 | 0 | — | 0 | 0 | 0 |

TABLE 6-continued

| Signature | Bit Position | | | | | | | |
|---|---|---|---|---|---|---|---|---|
| | i | i+1 | — | — | — | — | i+k−1 | i+k |
| — | 0 | 0 | 0 | 0 | — | 0 | 0 | 0 |
| — | 0 | 0 | 0 | 0 | — | 0 | 0 | 0 |
| i+k−1 | 0 | 0 | 0 | 0 | — | 0 | 0 | 0 |
| i+k | 0 | 0 | 0 | 0 | — | 0 | 0 | 1 |

Table 7 shows the signatures obtained by the compression of the repetitive error patterns in Table 6 (i.e., first compression).

TABLE 7

| Signature | Bit Position | | | | | | | |
|---|---|---|---|---|---|---|---|---|
| | i | i+1 | — | — | — | — | i+k−1 | i+k |
| i | 1 | 0 | 0 | 0 | — | 0 | 0 | 0 |
| — | 0 | 1 | 0 | 0 | — | 0 | 0 | 0 |
| — | 0 | 0 | 1 | 0 | — | 0 | 0 | 0 |
| — | 0 | 0 | 0 | 1 | — | 0 | 0 | 0 |
| — | 0 | 0 | 0 | 0 | — | 1 | 0 | 0 |
| i+k−1 | 0 | 0 | 0 | 0 | — | 0 | 1 | 0 |
| i+k | 0 | 0 | 0 | 0 | — | 0 | 0 | 0 |

As can be seen in Table 7, all the signature patterns other than the last one have error effects. Namely, each of the i-th through (i+k−1)-th signature patterns is a repetitive error pattern of distance 1 from the adjacent patterns. The last pattern (i.e., i-th signature pattern) has no error effect due to error masking.

Table 8 shows the signatures obtained by the compression of the repetitive error patterns in Table 7 (i.e., the second compression).

TABLE 8

| Signature | Bit Position | | | | | | | |
|---|---|---|---|---|---|---|---|---|
| | i | i+1 | — | — | — | — | i+k−1 | i+k |
| i | 1 | 0 | 0 | 0 | — | 0 | 0 | 0 |
| — | 0 | 0 | 0 | 0 | — | 0 | 0 | 0 |
| — | 0 | 0 | 1 | 0 | — | 0 | 0 | 0 |
| — | 0 | 0 | 0 | 0 | — | 0 | 0 | 0 |
| — | 0 | 0 | 0 | 0 | — | 0 | 0 | 0 |
| i+k−1 | 0 | 0 | 0 | 0 | — | 0 | 1 | 0 |
| i+k | 0 | 0 | 0 | 0 | — | 0 | 0 | 1 |

As shown in Table 8, upon compressing the even-numbered ones of k−1 signature patterns with error effects, the error masking occurs. The (i+k−1)-th signature pattern has an error effect which is propagated to the signature obtained by compressing the (i+k)-th signature pattern.

As described above, when the signature patterns obtained by the compression of the test pattern are recompressed by using the two stage MISRs 42-1 and 42-2 as shown in FIG. 4, the error masking due to the repetitive error patterns of the odd-numbered distances does not happen.

Second Embodiment

According to the compression result of the repetitive error patterns with distance 4 (see Table 4) described in the earlier background section of this application, all the signature patterns obtained by compressing the first through fourth test patterns have the error effects, but the last signature pattern (i.e., the second error pattern) has no error effect. The first through fourth signature patterns with the error effects are the repetitive error patterns of which the adjacent two have the distance of 1 to each other. Table 9 shows the compression result of the signatures in Table 4.

TABLE 9

| Signature | | | | | |
|---|---|---|---|---|---|
| 1 | 0 | 0 | 0 | 0 | 0 |
| 0 | 0 | 0 | 0 | 0 | 0 |
| 0 | 0 | 1 | 0 | 0 | 0 |
| 0 | 0 | 0 | 0 | 0 | 0 |
| 0 | 0 | 0 | 0 | 0 | 0 |

As can be seen in Table 9, during the compression of the signatures in Table 4 (i.e., the second compression), error masking appears both in the second and fourth signatures. The error effect is not transferred to the last signature.

The compression result of the signatures of Table 9 is listed in Table 10.

TABLE 10

| Signature | | | | | |
|---|---|---|---|---|---|
| 1 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |
| 0 | 0 | 0 | 0 | 0 | 0 |

As shown in Table 10, during the compression of Table 9 (i.e., the third compression), the error masking takes place on the third signature pattern, and no error effect is also propagated to the last signature.

If, however, the compression of the signature patterns of Table 10 is performed, then the resultant signature patterns are obtained as shown in Table 11 below.

TABLE 11

| Signature | | | | | |
|---|---|---|---|---|---|
| 1 | 0 | 0 | 0 | 0 | 0 |
| 0 | 1 | 0 | 0 | 0 | 0 |
| 0 | 0 | 1 | 0 | 0 | 0 |
| 0 | 0 | 0 | 1 | 0 | 0 |
| 0 | 0 | 0 | 0 | 1 | 0 |

As seen from Table 11, when the fourth compression for the repetitive patterns with the distance of 4 is performed, the error masking does not occur and the error effect is transferred to the last signature.

As described above, when the repetitive error patterns are compressed several times, no error masking happens.

The number of compression for the repetitive error pattern depends on the distance of the repetitive error patterns. Table 12 shows the cases where the error masking does not occur when the repetitive error patterns are compressed 1 through 16 times, respectively. In Table 12, x denotes "no error masking".

TABLE 12

| Repetitive Error Pattern Distance | Compression Number | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| 1 | | x | | x | | x | | x | | x | | x | | x | | x |
| 2 | | x | x | | | x | x | | | | x | x | | | x | x |
| 3 | | x | x | x | | x | x | x | | x | x | x | | x | x | x |
| 4 | | | | | x | x | x | x | | | | | x | x | x | x |
| 5 | | | | | x | x | x | x | | | | | x | x | x | x |
| 6 | | x | | x | x | x | x | x | | x | | x | x | x | x | x |
| 7 | | | x | x | x | x | x | x | | | x | x | x | x | x | x |
| 8 | | x | x | x | x | x | x | x | | x | x | x | x | x | x | x |
| 9 | | | | | | | | | x | x | x | x | x | x | x | x |
| 10 | | x | | | x | | x | x | x | x | x | x | x | x | x | x |
| 11 | | | x | x | | | x | x | x | x | x | x | x | x | x | x |
| 12 | | x | x | x | | x | x | x | x | x | x | x | x | x | x | x |
| 13 | | | | x | x | x | x | x | x | x | x | x | x | x | x | x |
| 14 | | x | | x | x | x | x | x | x | x | x | x | x | x | x | x |
| 15 | | | x | x | x | x | x | x | x | x | x | x | x | x | x | x |
| 16 | | x | x | x | x | x | x | x | x | x | x | x | x | x | x | x |
| Detectable Error Pattern Number | 0 | 8 | 8 | 12 | 9 | 13 | 13 | 15 | 8 | 12 | 12 | 14 | 13 | 15 | 15 | 16 |

It can be seen in Table 12 that the error masking appears in all the repetitive error patterns when the repetitive error patterns are compressed once, but there is no error masking when the repetitive error patterns are compressed 16 times. As shown in Table 12, the repetitive error patterns with no error masking are various in number and kind.

Since an excessive compression number causes the hardware overhead, it is desirable rather that the repetitive error patterns be compressed as many times as possible within the range of design rule than that they be compressed such times to have no error masking at all. An optimal compression number can be obtained by the following orders.

(1) The maximum distance Dmax between the possible repetitive error patterns is sought, regardless of the type of MISR to be implemented.

(2) A series of compression processes for the repetitive error patterns with the distances of 1 through Dmax is performed.

(3) The number C of compression processes with no signature error masking for the repetitive error patterns is calculated.

(4) The number of the repetitive error patterns for the respective compression processes without error masking is checked in relation with the respective compression numbers.

(5) The optimal number C of the MISRs (i.e., the appropriate compression number) is determined depending on the number of the repetitive error patterns. Namely, the optimal number C of the MISRs is preferably equal to or less than the maximum number Mmax of MISRs that an electronic circuit can hold.

(6) The number C of the MISRs are coupled in series.

Figure 5:
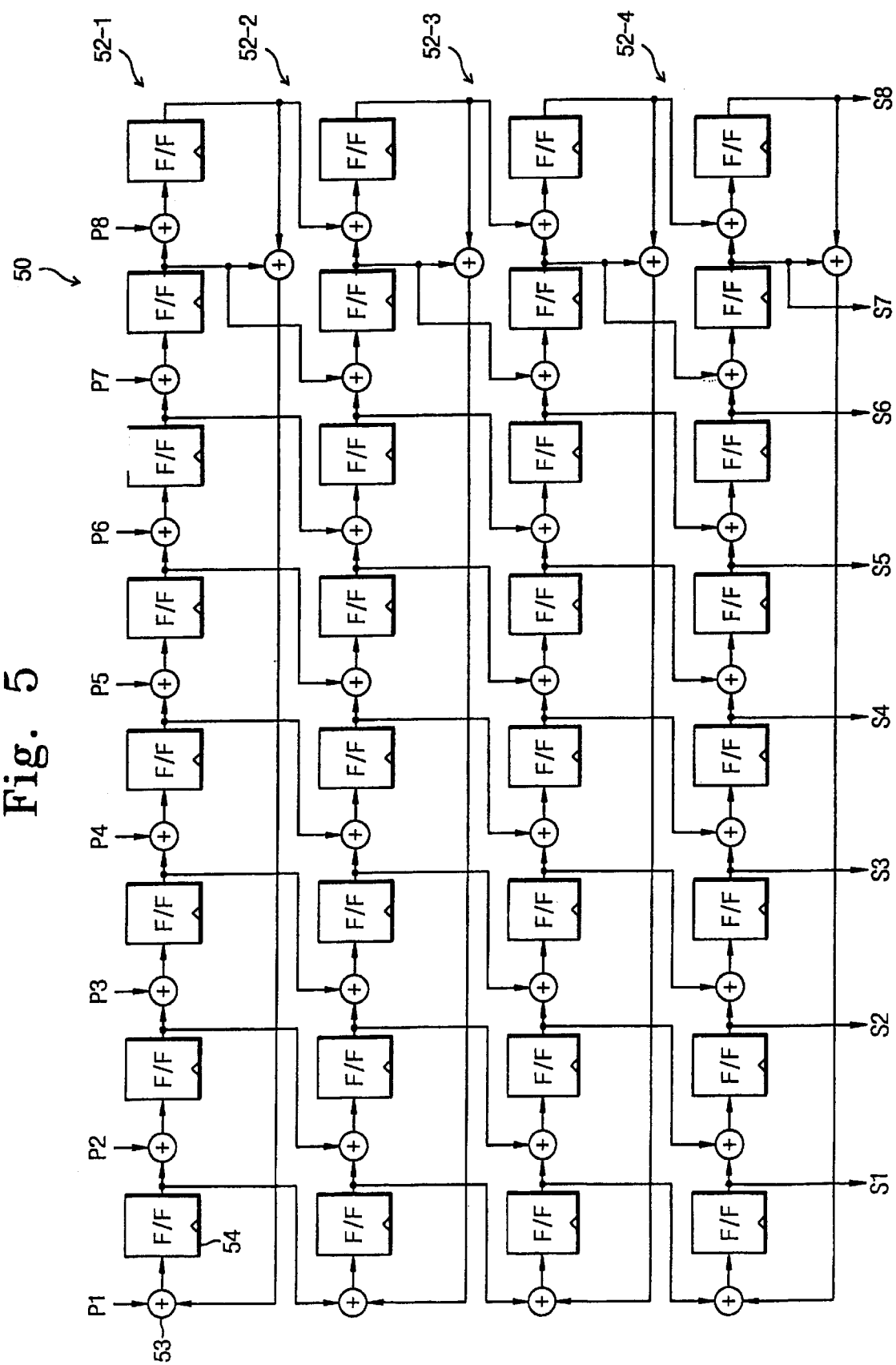
FIG. 5 is a circuit diagram illustrating another embodiment of a parallel signature compression circuit according to the present invention.

FIG. 5 shows an exemplary parallel signature compression circuit which compresses the repetitive error patterns four times in order to prevent the error masking. The signature compression circuit comprises four MISRs 52-1, 52-2, 52-3, and 52-4. Each MISR 52-j (j=1, 2, 3, or 4) includes 8 F—F circuits 54 corresponding to 8 input pattern bits P1–P8, respectively. Like the previous embodiment, each MISR has a feedback tap and each F—F circuit 54 coupled to the next F—F circuit on the upper bit side via a corresponding XOR gate 53 in the respective MISRs.

The 8-bit signature compression circuit 50 of FIG. 5 has a maximum detectable distance of 7. Therefore, the signature compression circuit 50 can detect the repetitive error patters with the distances 1, 2, 3, 6, and 7 (see Table 12), and eliminate the error masking due to the distances. Although, 8-bit MISRs are used in this embodiment, it is apparent that the ability for finding out faults in a circuit under test increases with progression of the bit number that the compression circuit has.

As described above, the signature compression circuit of the invention allows the error effect of at least one of two repetitive error patterns to be transferred to a cell other than the cell where the error effect is counterbalanced, so that the error masking probability of the repetitive error patterns can be reduced.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A compression circuit for compressing response data from an electronic circuit under test, said compression circuit comprising:

a first multiple input signature register (MISR) that compresses the response data to generate a first signature;

a second MISR coupled to said first MISR that compresses the first signature to generate a second signature and a third MISR coupled to said second MISR that compresses the second signature to generate a third signature.

2. The compression circuit of claim 1, wherein said first MISR, said second MISR and said third MISR each include at least one feedback tap.

3. A method for designing a compression circuit which includes at least two multiple input signature registers (MISRs) coupled in series and compresses response data from an electronic circuit under test, the method comprising the steps of:

seeking a maximum distance between possible repetitive error patterns;

performing a series of compression processes for the repetitive error patterns;

calculating the number of compression processes with no signature error masking for the repetitive error patterns;

checking the number of the repetitive error patterns for the respective compression processes without error masking; and determining the number of said MISRs depending on the number of the repetitive error patterns.

4. The method of claim 3, wherein the number of said MISRs is equal to or less than the maximum number of MISRs that an electronic circuit can hold.

5. A compression circuit for compressing a series of response patterns generated by an electronic circuit under test, the series of response patterns having a maximum distance between repetitive error patterns, the compression circuit comprising:

at least three serially-connected multiple input signature registers (MISRs) that receive input patterns and produce signatures therefrom, wherein a first MISR of the MISRs compresses the series of response patterns from the circuit under test, wherein respective other ones of the other MISRs compress signatures generated by a preceding MISR, and wherein the number of the at least three MISRs is sufficient to prevent error masking for distances between repetitive error patterns that are less than the maximum distance between repetitive error patterns.

6. A compression circuit according to claim 5, wherein each of the at least three serially connected MISRs include at least one feedback tap.

7. A method of generating signatures from a series of response patterns generated by a circuit under test, the method comprising:

determining one or more selected distances between possible repetitive error patterns in the series of response patterns for which it is desired to prevent error masking;

determining a number of serial compressions that prevent error masking for the determined one or more selected distances; and serially compressing the series of response patterns the number of serial compressions to generate a series of signatures.

8. A method according to claim 7, wherein the step of determining one or more selected distances comprises the step of determining one or more selected distances that are less than a maximum distance between repetitive error patterns in the series of response patterns.

* * * * *